United States Patent
Kim

(10) Patent No.: US 8,733,245 B2
(45) Date of Patent: May 27, 2014

(54) SCREEN PRINTER

(75) Inventor: Dong-Joon Kim, Seongnam-si (KR)

(73) Assignee: Samsung Techwin Co., Ltd., Changwon-si (KR)

(*) Notice: Subject to any disclaimer, the term of this patent is extended or adjusted under 35 U.S.C. 154(b) by 408 days.

(21) Appl. No.: 13/023,950

(22) Filed: Feb. 9, 2011

(65) Prior Publication Data

US 2011/0192296 A1 Aug. 11, 2011

(30) Foreign Application Priority Data

Feb. 9, 2010 (KR) .................. 10-2010-0011951
Jan. 18, 2011 (KR) .................. 10-2011-0004941

(51) Int. Cl.
*B41L 13/02* (2006.01)

(52) U.S. Cl.
USPC ...................................... 101/123; 101/127.1

(58) Field of Classification Search
USPC ............. 101/123, 124, 127, 127.1, 129
See application file for complete search history.

(56) References Cited

U.S. PATENT DOCUMENTS

| | | | | |
|---|---|---|---|---|
| 2,209,688 A | * | 7/1940 | Davis | 101/124 |
| 4,195,567 A | * | 4/1980 | Mitter | 101/115 |
| 5,107,760 A | * | 4/1992 | Pratt | 101/115 |
| 6,568,321 B2 | * | 5/2003 | Sakamoto | 101/126 |
| 6,772,575 B2 | * | 8/2004 | Limousin | 53/442 |
| 7,171,898 B2 | * | 2/2007 | Marszalkowski, Jr. | 101/129 |
| 7,434,510 B2 | * | 10/2008 | Messmer et al. | 101/424 |

FOREIGN PATENT DOCUMENTS

| | | | |
|---|---|---|---|
| JP | 63-260445 A | | 10/1988 |
| JP | 04107146 A | * | 4/1992 |
| JP | 05084895 A | * | 4/1993 |
| JP | 5-330131 A | | 12/1993 |
| JP | 7-214747 A | | 8/1995 |
| JP | 7-251225 A | | 10/1995 |
| JP | 2001-219533 A | | 8/2001 |
| KR | 20-0169733 Y1 | | 3/1995 |
| KR | 10-0327232 B1 | | 6/2000 |
| KR | 10-0462794 B1 | | 11/2003 |
| KR | 10-0508342 B1 | | 11/2003 |

* cited by examiner

*Primary Examiner* — Ren Yan
(74) *Attorney, Agent, or Firm* — Sughrue Mion, PLLC

(57) ABSTRACT

Provided is a screen printer including a main body in which an operation region and at least one introduction and extraction portion are formed, wherein the operation region includes an installation position of a stencil mask therein, and, through the at least one introduction and extraction portion, the stencil mask is introduced into the operation region and is extracted from the operation region to an outside of the main body; and a conveyance unit which conveys the stencil mask introduced into and disposed at the operation region to the at least one introduction and extraction portion when the stencil mask is replaced by a new stencil mask introduced through the at least one introduction and extraction portion, and conveys the new stencil mask to the operation region.

17 Claims, 8 Drawing Sheets

SCREEN PRINTER

CROSS-REFERENCE TO RELATED APPLICATION

This application claims priority from Korean Patent Application No. 10-2010-0011951 filed Feb. 9, 2010 and Korean Patent Application No. 10-2011-0004941 filed Jan. 18, 2011, the disclosures of which are hereby incorporated herein by reference in their entirety.

BACKGROUND

1. Field

Apparatuses consistent with exemplary embodiments relate to a screen printer, and more particularly, to a screen printer capable of easily exchanging a stencil mask with a new one, by forming introduction and extraction portions for a stencil mask without having to manually open/close a cover.

2. Description of the Related Art

In general, a screen printer is an apparatus for applying a cream solder-type lead solution to install parts such as an integrated circuit (IC), a resistor, and so on, in a plurality of contact spaces formed on a surface of a printed circuit board (PCB).

A related-art screen printer includes a conveyor installed in an operation region of a main body and conveying a PCB introduced from the outside in both directions, an operation stage configured to position a stencil mask on the conveyor, a squeegee configured to move over the stencil mask positions on the operation stage in both directions and introduce a lead solution disposed on a surface of the stencil mask into each contact space of the PCB, a camera configured to move in both directions and check a position of the PCB and the stencil mask, a cleaning apparatus configured to clean holes of the stencil mask, through which the lead solution passes, and so on.

Such a related-art screen printer moves the PCB onto an operation plate having an operation conveyor disposed at a center position using an introduction-side conveyor, and then, identifying an identification mark attached to the PCB, and an identification mark attached to the stencil mask to precisely align solder surfaces on the PCB with the lead solution passing holes correspondingly punched in the stencil mask.

Next, after the operation conveyor is raised and the stencil mask and squeegee are lowered to adhere the stencil mask and the PCB, a squeegee blade is moved to and fro such that lead disposed on the stencil mask is pushed by the squeegee blade to pass through the lead solution passing holes on the stencil mask, applying the lead on the solder surfaces on the PCB. Next, the PCB on which the lead is applied is conveyed from a center conveyor to a discharge-side conveyor disposed at an opposite side of the introduction-side conveyor to be discharged.

The screen printer described above needs modification operation of a production model during equipment management. During the modification operation of the production model, a stencil mask change operation for printing on a new substrate, a position correction operation of a backup pin for improving print quality of the PCB, an operation of exchanging a backup block, etc. with a new one, an operation of aligning the stencil mask to increase print precision, and so on are performed.

Among them, in order to perform the stencil mask change operation, an operator opens a cover rotatably installed at a front surface of the screen printer, extracts the used stencil mask to the outside, and introduces a new stencil mask.

However, in the related-art screen printer, after an operator opens the cover, since the operation of introducing a new stencil mask through the open portion must be performed, the number of manual operations during equipment management increases, and the stencil mask change operation becomes very troublesome.

In addition, while temperature in the screen printer must be uniformly maintained, when the operator opens the cover of the screen printer to change the stencil mask with a new one, the temperature in the screen printer becomes affected by external temperatures different therefrom, decreasing operation performance of the screen printer and causing operation error.

SUMMARY

One or more exemplary embodiments address aforementioned aspects associated with the related-art screen printer by providing a screen printer capable of separately forming at least one introduction and extraction portion of which a dimension, such as width and height, is similar to a corresponding dimension of a stencil mask without a separate open-type cover, counting a preset standby time when introduction of the stencil mask is detected and semi-automatically introducing the stencil mask through the at least one introduction and extraction portion, preventing the temperature inside the screen printer from being abnormally varied by an external temperature, normally maintaining the operation performance of the screen printer, and reducing the number of manual operations, in which an operator introduces the stencil mask into the screen printer because there is no need for manual operations of opening/closing the cover provided in the related-art screen printer.

According to an aspect of an exemplary embodiment, there is provided a screen printer including: a main body in which an operation region and at least one introduction and extraction portion are formed, wherein the operation region comprises an installation position of a stencil mask therein, and, through the at least one introduction and extraction portion, the stencil mask is introduced into the operation region and is extracted from the operation region to an outside of the main body; and a conveyance unit which conveys the stencil mask introduced into and disposed at the operation region to the at least one introduction and extraction portion when the stencil mask is replaced by a new stencil mask introduced through the at least one introduction and extraction portion, and conveys the new stencil mask to the operation region.

The at least one introduction and extraction portion may have a slot shape. The at least one introduction and extraction portion may include a blocking member which is configured to open or close the at least one introduction and extraction portion with respect to the outside of the main body. A dimension of the at least one introduction and extraction portion may be substantially the same as a dimension of a side of the stencil mask facing the at least one introduction and extraction portion when the stencil mask is introduced into the operation region or extracted from the operation region to the outside of the main body The blocking member may be attached to at least one part of the main body where the at least one introduction and extraction portion is formed, and may be configured to open or close the at least one introduction and extraction portion by rotation. The blocking member may be attached to the at least one part of the main body through a shaft which comprises an elastic member providing a torsional elastic force which returns the blocking member from a position at which the at least one introduction and extraction portion is open to a position at which the at least one introduction and extraction portion is closed.

The at least one introduction and extraction portion may include an introduction side portion and an extraction side portion, wherein the introduction side portion may be configured such that the stencil mask is extracted from the operation region to the outside of the main body through the extraction side portion, and the introduction side portion may be configured such that the new stencil mask is introduced into the operation region through the introduction side portion.

The at least one introduction and extraction portion may be a single introduction and extraction portion, and the single introduction and extraction portion may be provided at one side of the main body. The stencil mask may be extracted from the operation region to the outside of the main body through the single introduction and extraction portion, and the new stencil mask may be introduced into the operation region through the single introduction and extraction portion.

The conveyance unit may include: at least one mask guide which slidably supports the stencil mask to introduce the stencil mask into the operation region and extract the stencil mask from the operation region to the outside of the main body along a conveyance path provided in the main body; a slide part which reciprocates along the conveyance path; and a conveyance part which is connected to the slide part and contacts a front or rear end of the stencil mask so that the stencil part moves along the conveyance path.

At least one seating groove having an "L" shape configured to support the stencil mask may be formed in an upper surface of the at least one mask guide.

The conveyance part may include a rod which contacts the front or rear end of the stencil mask, wherein the rod may include a packing formed at an end thereof to attenuate an impact when the rod contacts the front or rear end of the stencil mask.

The screen printer may further include a detection sensor which is disposed in the operation region adjacent to the at least one introduction and extraction portion, and detects introduction of the stencil mask into the main body through the at least one introduction and extraction portion, and generates a detection signal when the introduction is detected.

The detection sensor may include a plurality of sensors which are installed at a position of the operation region and respective positions where the stencil mask is introduced into the main body and extracted from the operation region, and generate the detection signal of the stencil mask at the position and the respective positions, respectively.

The conveyance unit may control the stencil mask to be extracted from the operation region after a preset operation standby time from a time when the stencil mask is introduced into the operation region.

BRIEF DESCRIPTION OF THE DRAWINGS

The above and other aspects will be described in reference to exemplary embodiments with reference to the attached drawings, in which.

DETAILED DESCRIPTION OF EXEMPLARY EMBODIMENTS

Exemplary embodiments will now be described more fully hereinafter with reference to the accompanying drawings.

The inventive concept may, however, be embodied in different forms and should not be construed as limited to the exemplary embodiments set forth herein. Rather, these exemplary embodiments are provided so that this disclosure will be thorough and complete, and will fully convey the scope of the inventive concept to those skilled in the art.

Figure 1:
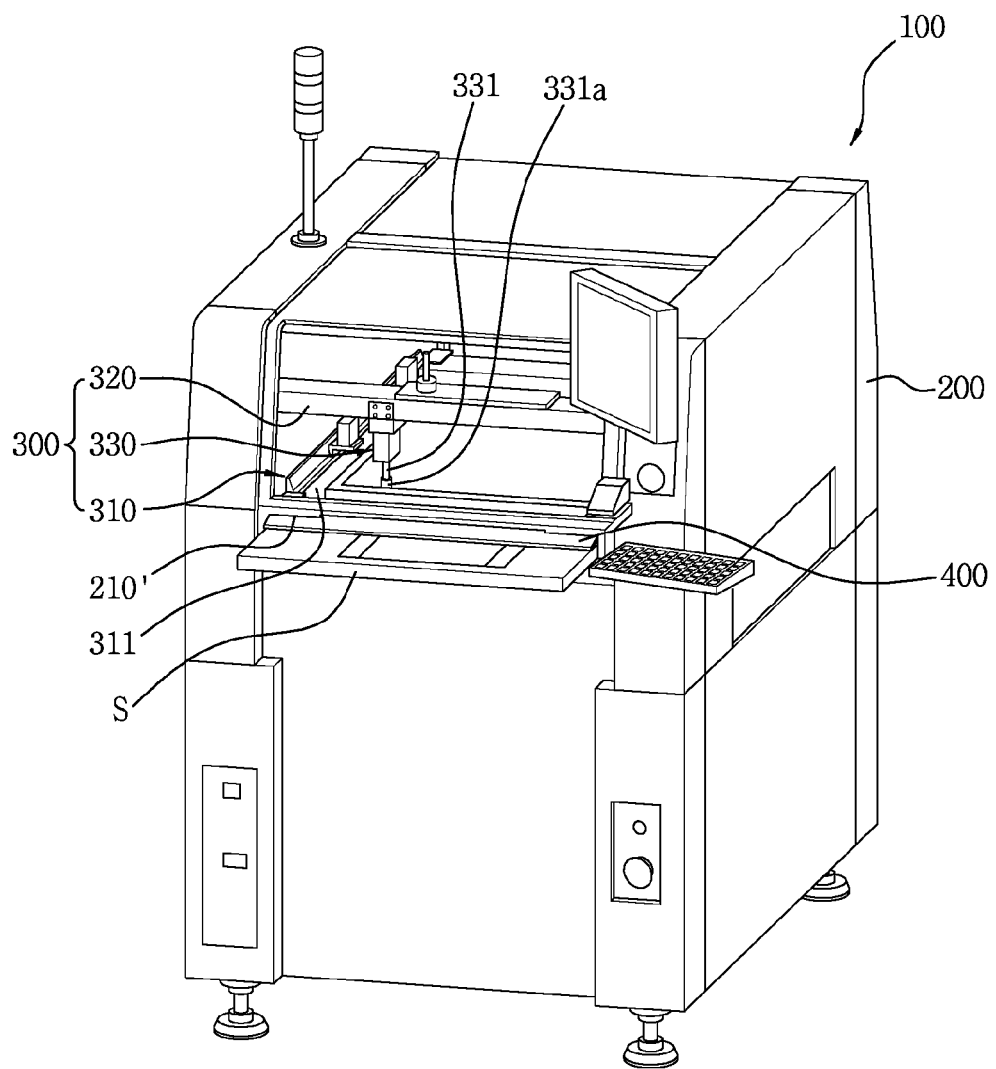
FIG. 1 is a perspective view showing a screen printer in accordance with an exemplary embodiment.
Figure 2:
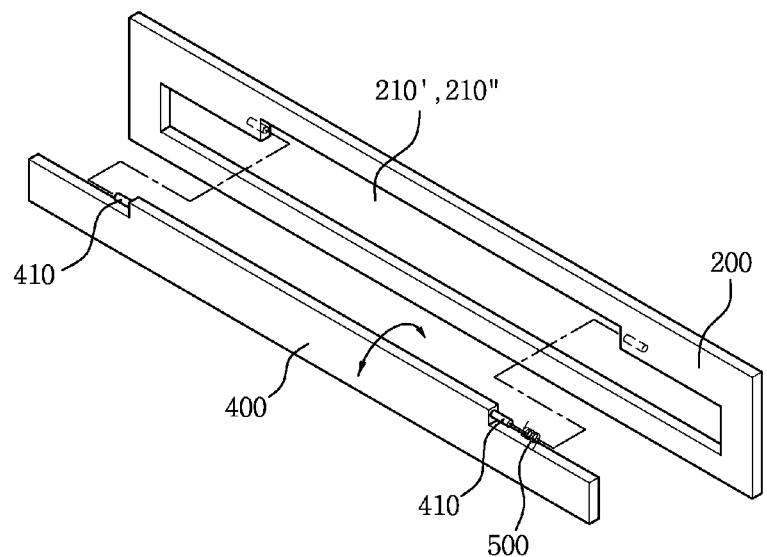
FIG. 2 is an enlarged perspective view of an introduction and extraction portion and a blocking member of the screen printer in accordance with an exemplary embodiment.
Figure 3:
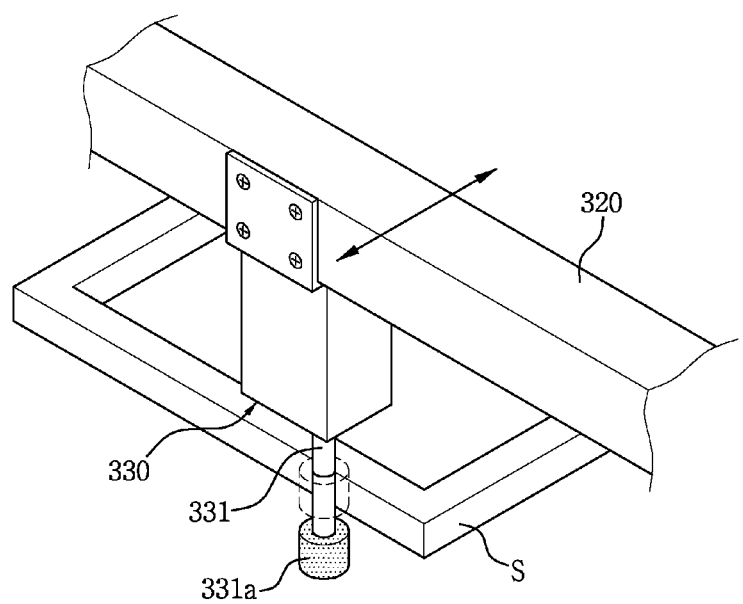
FIG. 3 is an enlarged perspective view of a slide part and a conveyance cylinder of the screen printer in accordance with an exemplary embodiment.
Figure 4A:
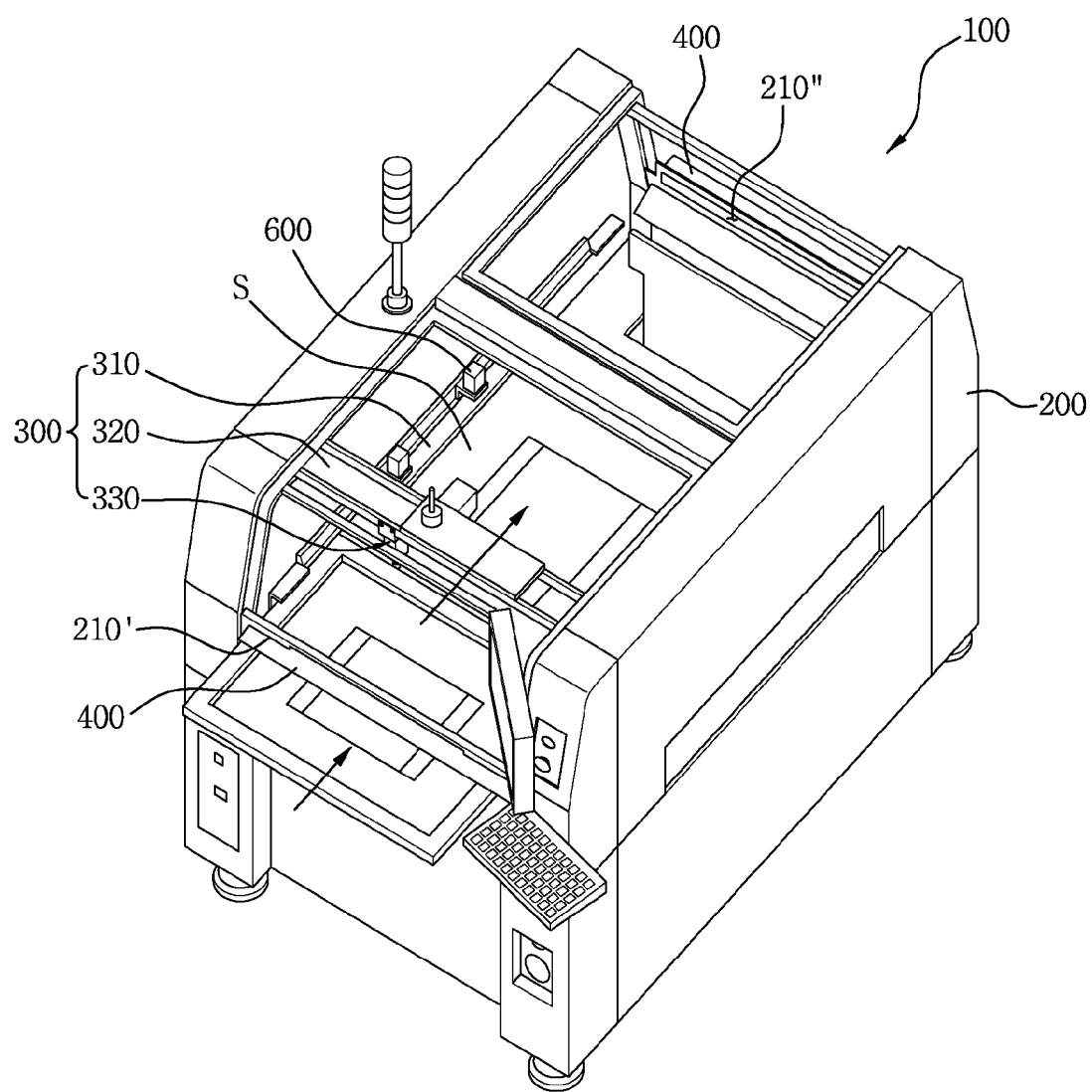
FIGS. 4A to 4C show operation states of the screen printer in accordance with an exemplary embodiment.
Figure 4B:
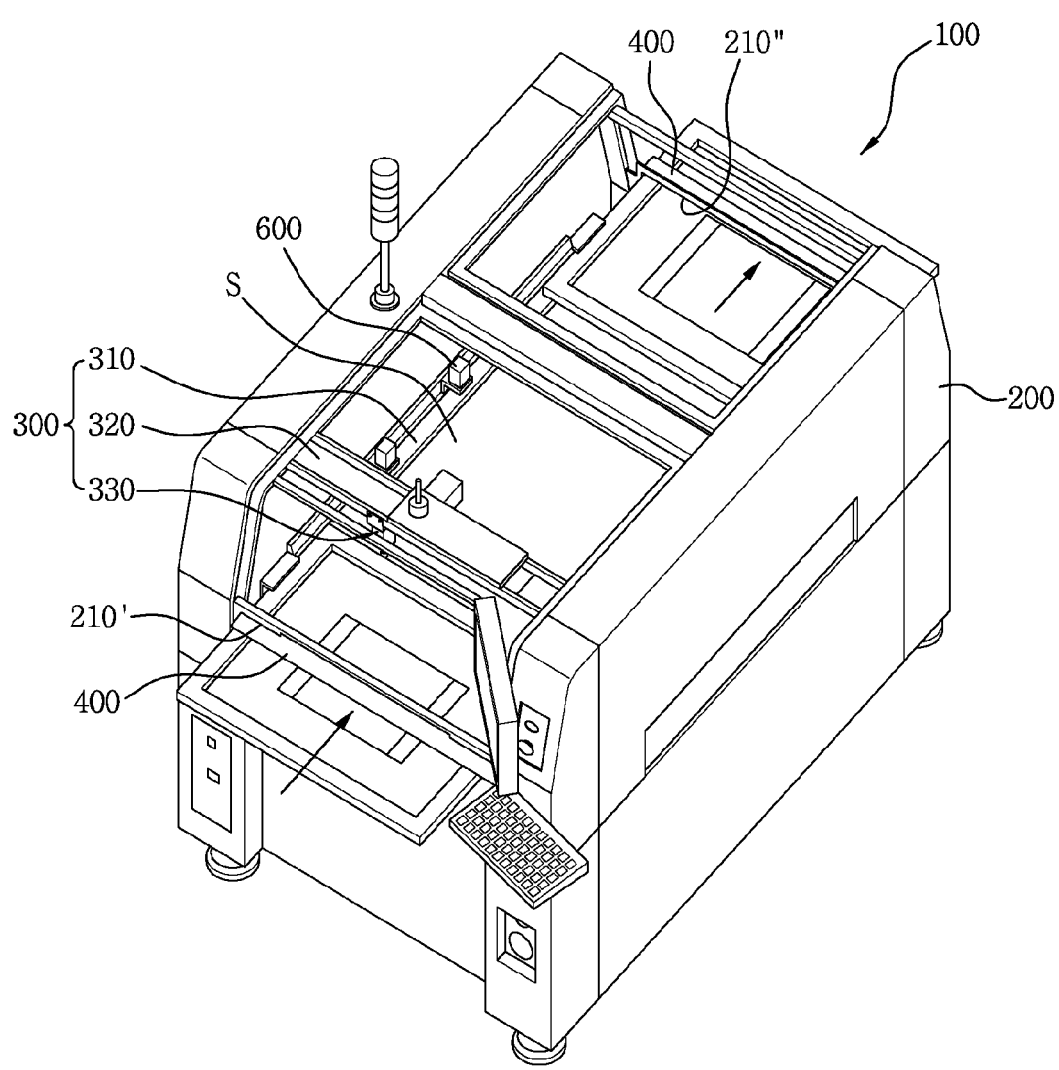
Figure 4C:
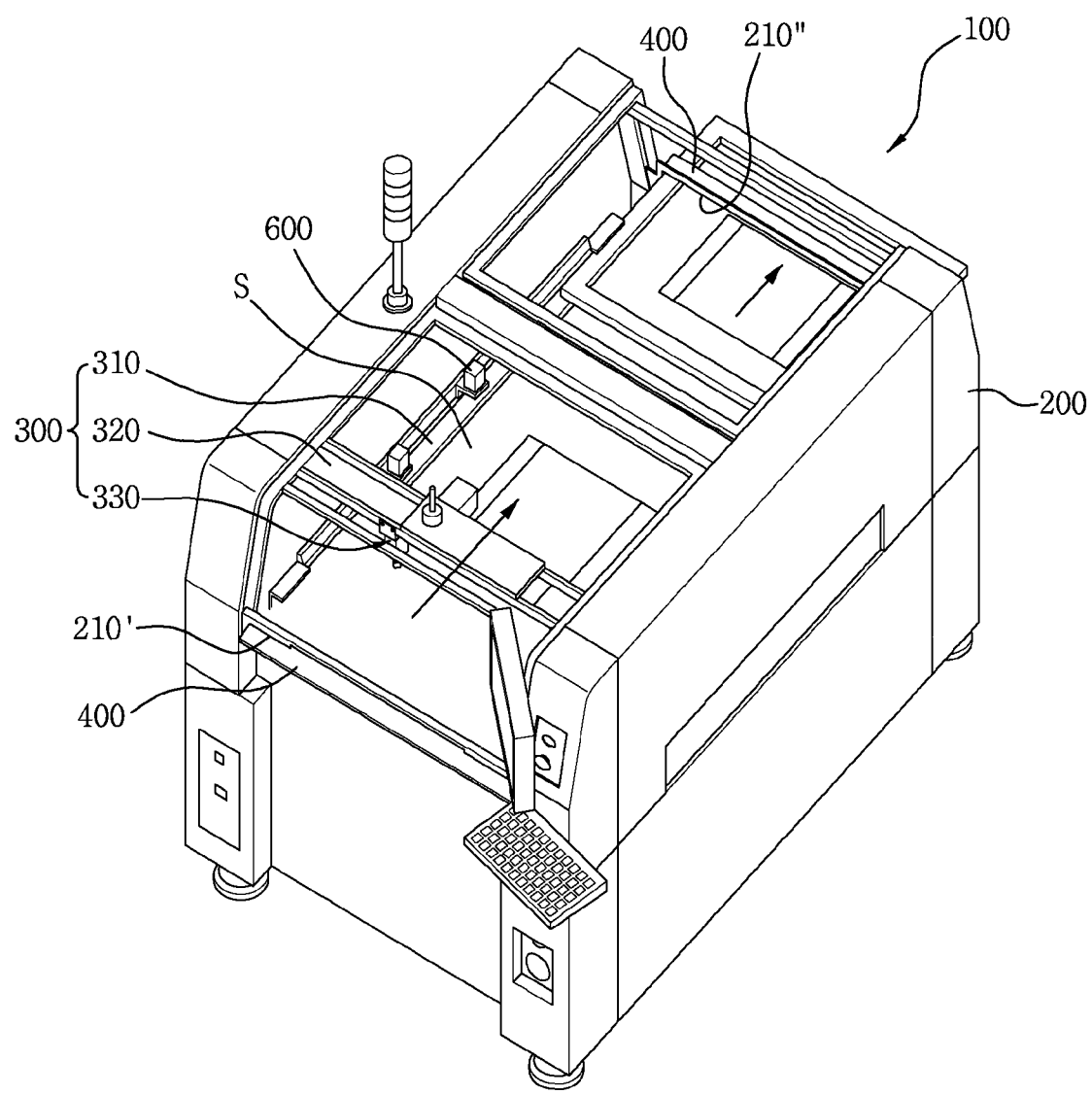

FIG. 1 is a perspective view showing a screen printer in accordance with an exemplary embodiment, FIG. 2 is an enlarged perspective view of an introduction and extraction portion and a blocking member of the screen printer in accordance with an exemplary embodiment, FIG. 3 is an enlarged perspective view of a slide part and a conveyance cylinder of the screen printer in accordance with an exemplary embodiment, FIGS. 4A to 4C show operation states of the screen printer in accordance with an exemplary embodiment, and FIGS. 5A to 5F are plan views schematically showing various modes of a stencil mask in the screen printer in accordance with exemplary embodiments.

As shown in FIGS. 1 to 5F, a screen printer 100 includes a main body 200, in which an operation region is formed as an installation position of a stencil mask S therein, having introduction and extraction portions 210' and 210" such that the stencil mask S is introduced or the stencil mask S is extracted from the operation region to the outside, and a conveyance unit 300 configured to convey the stencil mask S introduced to and disposed at the operation region to the introduction and extraction portion 210" when the stencil mask S is changed with a new stencil mask S, and convey the stencil mask S introduced from the introduction and extraction portion 210' to the operation region. Here, the introduction and extraction portions 210' and 210" may have a slot shape.

A conveyor (not shown) configured to convey a PCB in both directions, and an operation stage (not shown) configured to position the stencil mask S on the conveyor may be disposed in an internal operation region of the main body 200.

In addition, the screen printer 100 may include a squeegee (not shown) configured to move on the operation stage in both directions, and introduce a lead solution disposed on a surface of the stencil mask S to each contact space of the PCB (not shown), a camera (not shown) configured to move in both directions and identify positions of the PCB and the stencil mask S, a cleaning apparatus (not shown) configured to clean holes of the stencil mask S through which a lead solution passes, and so on.

Since the conveyor, the squeegee, the camera and the cleaning apparatus are generally applied components, and detailed description thereof will be omitted.

The introduction and extraction portions 210' and 210" are formed to introduce the stencil mask S into the operation region of the main body 200, or extract the stencil mask S from the operation region. The introduction and extraction portions 210' and 210" may be configured to have a dimension, such as width and height, equal to or slightly greater than a corresponding dimension of the stencil mask S to prevent affection due to external temperatures. The corresponding dimension of the stencil mask S may be a width and a height of a side of the stencil mask S facing the introduction and extraction portions 210' and 210" when the stencil mask S is introduced to and extracted from the operation region of the main body 200.

In the introduction and extraction portions 210' and 210", a blocking member 400 may be provided. The block member 400 may be configured to be opened when the stencil mask S is introduced, and returned to its original position to close the introduction and extraction portions 210' and 210" when the stencil mask S is extracted.

Both sides of the blocking member 400 have shafts 410 axially fastened to both inner ends of the introduction and extraction portions 210' and 210" to be opened/closed by rotation about the shafts 410.

The shafts 410 may include elastic members 500 formed at both longitudinal ends thereof to apply a torsional elastic force to return the blocking member 400 to a closed position. Here, one ends of the elastic members 500 may be connected to the shafts 410, and the other ends may be connected to inner ends of the introduction and extraction portions 210' and 210" or the main body 200.

That is, when the stencil mask S is introduced into the introduction-side introduction and extraction portion 210' formed in the front of the main body 200, the blocking member 400 is pushed by the introduction-side end of the stencil mask S to be rotated toward the main body 200.

As described above, the blocking member 400 can be automatically returned to its original position by the elastic force thereof to close the introduction and extraction portions 210' and 210" after the stencil mask S passes through the introduction and extraction portions, without interference from the introduction of the stencil mask S.

While an opening direction of the blocking member 400 may be toward the operation region of the main body 200, the stencil mask S may also be introduced, after an operator pivots the blocking member 400 to a front side of the main body 200, through the opened introduction-side introduction and extraction portion 210'.

Therefore, it is possible to prevent introduction of impurities through the introduction and extraction portions 210' and 210" from which the blocking member 400 is opened, and prevent influence of external temperatures on the temperature in the operation region. In addition, troublesome manual operation of opening/closing a cover of the related-art screen printer to change the stencil mask S can be removed.

The conveyance unit 300 functions to move the stencil mask S to be extracted toward the extraction-side introduction and extraction portion 210" formed at a rear side of the main body 200, or convey a new stencil mask S to the operation stage upon change of the stencil mask S.

The conveyance unit 300 may include a pair of mask guides 310 configured to define a conveyance path between the introduction-side introduction and extraction portion 210' and the extraction-side introduction and extraction portion 210", and slidably support both ends of the stencil mask S, a slide part 320 installed to receive power from a drive unit (not shown) and to be reciprocated along a conveyance path of the stencil mask S, a conveyance cylinder 330 installed at the slide part 320 and configured to be hooked by a front or rear end of the stencil mask S when a rod 331 that projects or contracts from/into a lower part thereof is lowered, or release the hooking of the stencil mask S when the rod 331 is raised, and a control unit (not shown) electrically connected to the conveyance cylinder 330 and the slide part 320, and configured to receive a change signal of the stencil mask S from the outside to drive the conveyance cylinder 330 and the drive unit (not shown) connected to the slide part 320.

Seating grooves 311 having an "L" shape may be formed in upper surfaces of the pair of mask guides 310 to oppose each other to support both ends of the stencil mask S.

The rod 331 may be provided with a packing 331a formed at an end thereof to attenuate the impact when the end is hooked by the end of the stencil mask S. That is, when the end of the rod 331 provided with the packing 331a is hooked by the front or rear end of the stencil mask S, the stencil mask S is moved with movement of the slide part 320.

The main body 200 is provided with the control unit (not shown) configured to drive the conveyance unit 300, and may further include detection sensors 600 disposed in the operation region of the main body 200 adjacent to the introduction-side introduction and extraction portion 210' to detect introduction of the stencil mask S, and apply detection signals to the control unit when the introduction is detected.

The detection sensors 600 may be installed at a position of the operation region and introduction and extraction positions with the operation region interposed therebetween to apply the detection signals of the stencil mask S at the respective positions to the control unit.

That is, three detection sensors 600 may be installed to detect a position of the stencil mask S at the operation region, and introduction and extraction positions. The number and position of the detection sensors 600 is not limited thereto but may be variously applied.

When the detection signals of the detection sensors 600 are applied, the control unit may drive components of the conveyance unit 300 after an operation standby time preset from the time that the detection signal is applied.

That is, the detection sensors 600 detect a state in which an operator inserts the stencil mask S into the introduction and extraction portions 210' and 210" to a certain length or completely inserts the stencil mask S, and the control unit counts a preset operation standby time.

When the count is completed, the conveyance unit 300 is driven by the control unit to move the stencil mask S to be extracted to the extraction-side introduction and extraction portion 210", and convey another stencil mask S disposed at the introduction-side introduction and extraction portion 210' to the operation stage.

Hereinafter, an operation sequence of the screen printer 100 in accordance with an exemplary embodiment will be described below with reference to FIGS. 4A to 4C.

First, when the operator inserts a stencil mask S through the introduction-side introduction and extraction portion 210' to a certain length or completely, the blocking member 400 rotatably installed at the introduction and extraction portions 210' and 210" contacts the end of the stencil mask S to be pushed and rotated toward the operation region of the main body 200. Here, the detection sensors 600 detect insertion of the stencil mask S, and the control unit that receives the detection signals of the detection sensors 600 counts the preset operation standby time.

When the count is completed, the slide part 320 moves along the conveyance path to be positioned on the stencil mask S to be extracted, and the rod 331 of the conveyance cylinder 330 installed at the slide part 320 is lowered to contact the front or rear end of the stencil mask S.

Next, after the slide part 320 moves along the conveyance path to move the stencil mask S to be extracted to the extraction-side introduction and extraction portion 210", the rod 331 of the conveyance cylinder 330 is raised to its original position.

Finally, after the slide part 320 moves to the extraction-side introduction and extraction portion 210" to be disposed on a new stencil mask S, the new stencil mask S is moved onto the operation stage to complete a change operation of the stencil mask S similar to the operation.

As shown in FIGS. 5A to 5F, the introduction and extraction portions 210' and 210" may be provided at both sides of the main body 200 as an introduction side and an extraction side, directions of the introduction-side introduction and extraction portion 210' and the extraction-side introduction and extraction portion 210" may be interchangeable. In addition, both introduction and extraction of the stencil mask S may be performed through the introduction-side introduction and extraction portion 210' and the extraction-side introduction and extraction portion 210" Alternatively, the introduction and extraction portions 210' and 210" may be provided at one side of the main body 200 and both introduction and extraction of the stencil mask S may be performed through the introduction and extraction portions 210' and 210".

In other words, the introduction-side introduction and extraction portion 210' and the extraction-side introduction and extraction portion 210" allow both introduction and extraction of the stencil mask S, and the conveyance unit 300 may convey the stencil mask S introduced through the introduction-side introduction and extraction portion 210' or the extraction-side introduction and extraction portion 210" in an opposite direction or an introduction direction.

That is, the detection sensors 600 are installed at a position of the operation region, and the introduction and extraction positions with the operation region interposed therebetween, and at the respective positions, the detection signal that the stencil mask S is detected is applied to the control unit.

According to an exemplary embodiment, a first sensor 600 detects the stencil mask S at a front side of the main body 200 upon introduction and extraction thereof, a second sensor 600 detects the stencil mask S in a normal installation state, and a third sensor 600 detects the stencil mask S at a rear side of the equipment upon introduction and extraction thereof.

Figure 5A:
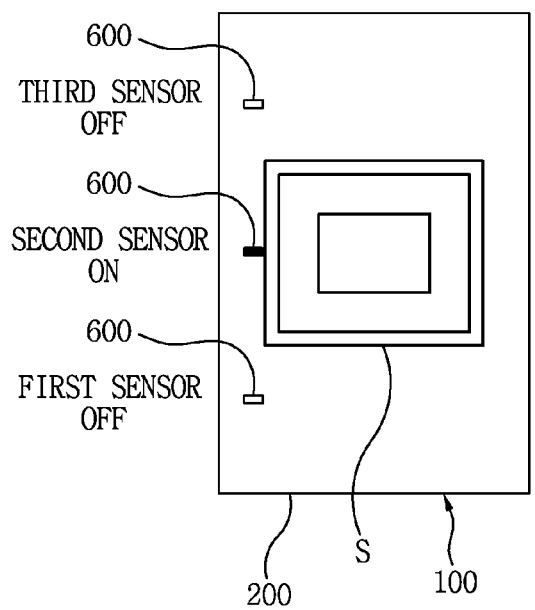
FIGS. 5A to 5F are plan views schematically showing various modes of a stencil mask in the screen printer in accordance with exemplary embodiments.

FIG. 5A shows a normal installation state of a stencil mask S in the screen printer 100 as shown in FIGS. 1 and 4A to 4C. In the normal installation state, the stencil mask S is disposed at a position at which a PCB can be printed, and in this state, the second sensor 600 detects the stencil mask S.

Figure 5B:
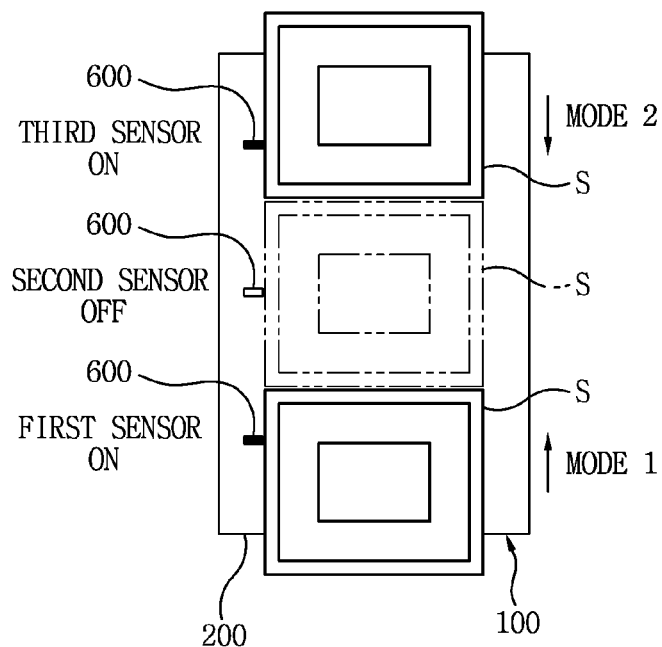

FIG. 5B shows two modes, Modes 1 and 2, of loading the stencil mask S to a position of the normal installation state.

In Mode 1 of introducing the stencil mask S through the front side of the main body 200, the stencil mask S is disposed at the front side of the main body 200 such that the first sensor 600 detects the stencil mask S. In Mode 2 of introducing the stencil mask S through the rear side of the equipment, the stencil mask S is disposed at the front side of the main body 200 such that the third sensor detects the stencil mask S.

Figure 5C:
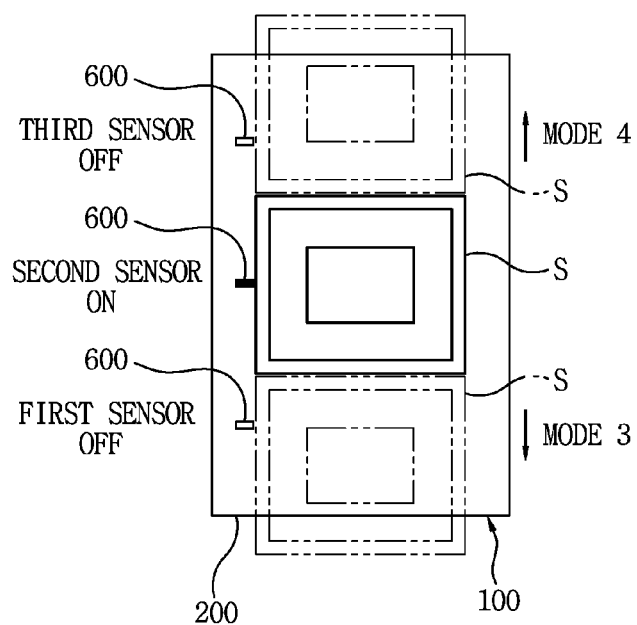

FIG. 5C shows two modes, Modes 3 and 4, of extracting the stencil mask S through the introduction and extraction portions 210' and 210".

In Mode 3, the stencil mask S is extracted through the front side of the main body 200, and in Mode 4, the stencil mask S is extracted through the rear side of the equipment.

Figure 5D:
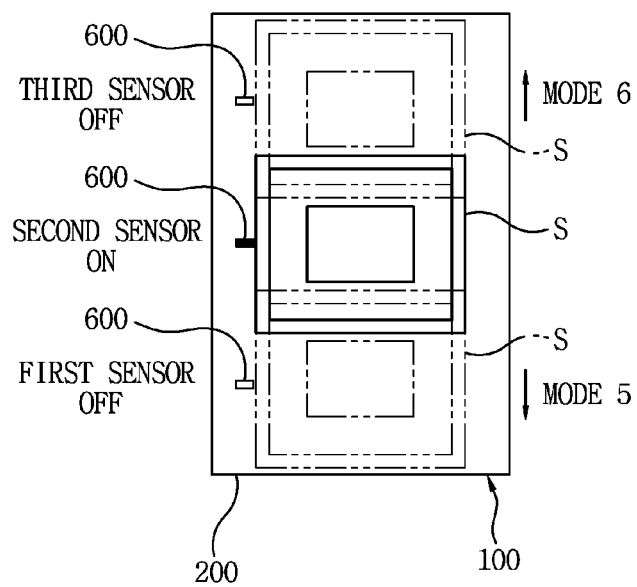

FIG. 5D shows two modes, Modes 5 and 6, of removing the stencil mask S to perform a cleaning process in which an operator manually removes the stencil mask S. That is, as the stencil mask is positioned at an end of the equipment, the operator can open a cover (now shown) of the screen printer 100 and manually remove the stencil mask S. In Mode 5, the stencil mark is cleaned at the front side of the main body 200, and in Mode 6, the stencil mark is cleaned at the rear side of the main body 200.

Figure 5E:
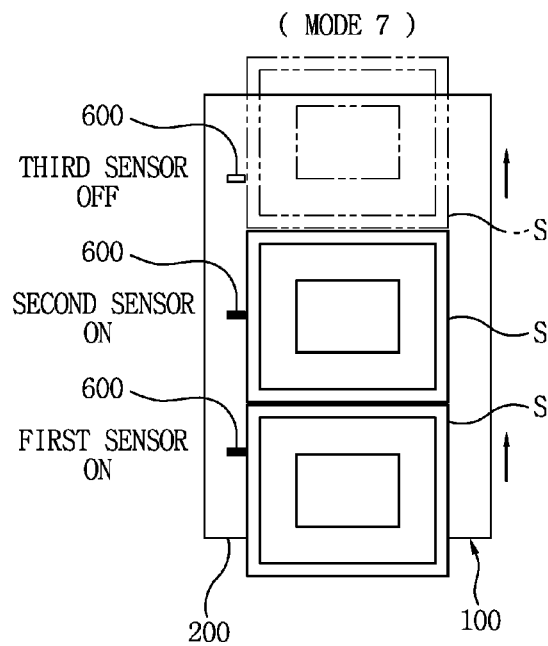
Figure 5F:
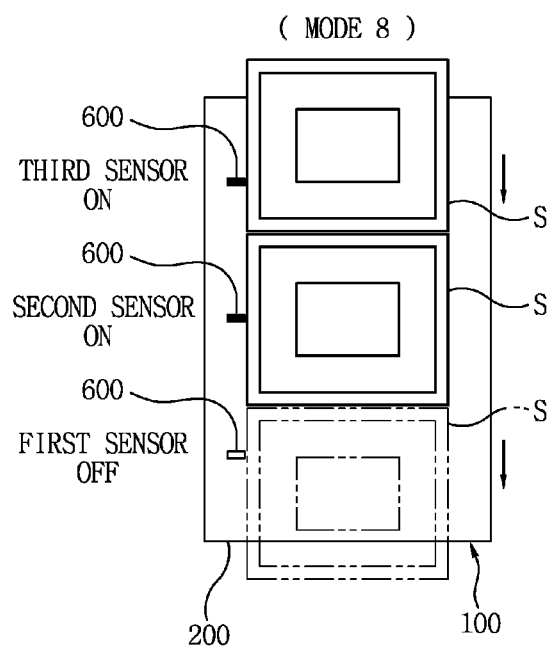

FIGS. 5E and 5F respectively show two modes, Modes 7 and 8, of changing the stencil mask S with a new stencil mask S or replacing the stencil mask S with a new stencil mask S.

In Mode 7, as shown in FIG. 5E, the stencil mask S in the normal installation state is extracted through the rear side of the main body 200, and a new stencil mask S is introduced through the front side of the main body 200 and disposed in the position of the normal installation state. In Mode 8 as shown in FIG. 5F, the stencil mask S in the normal installation state is extracted through the front side of the main body 200, and a new stencil mask S is introduced through the rear side of the main body 200 and disposed in the position of the normal installation state. Modes 7 and 8 also show how the stencil mask S may be temporarily stored in the screen printer 100 before it is replaced by a new stencil mask.

The above-described modes may be interchangeably used to replace the stencil mask S in the main body 200 with a new stencil mask S, according to exemplary embodiments. For example, if the stencil mask S is extracted through the front side of the main body 200 in Mode 3 (FIG. 5C), Mode 1 (FIG. 5B) of introducing a new stencil mask S through the same front side of the main body 200 may be used. That is, when the main body 200 has the introduction-side introduction and extraction portion 210' but does not have the extraction-side introduction and extraction portion 210" or the extraction-side introduction and extraction portion 210" is inoperable, both extraction of the stencil mask S and introduction of a new stencil mask S may be performed through the introduction-side introduction and extraction portion 210'. Likewise, if the stencil mask S is extracted through the rear side of the main body 200 in Mode 4 (FIG. 5C), Mode 2 (FIG. 5B) of introducing a new stencil mask S through the same rear side of the main body 200 may be used. That is, when the main body 200 has the extraction-side introduction and extraction portion 210" but does not have the introduction-side introduction and extraction portion 210' or the introduction-side introduction and extraction portion 210' is inoperable, both extraction of the stencil mask S and introduction of a new stencil mask S may be performed through the extraction-side introduction and extraction portion 210".

Eventually, since the introduction and extraction portions 210' and 210" of which a dimension, such as width and height, is equal or slightly greater that a corresponding dimension of the stencil mask S are separately formed in the screen printer 100 without a separate open-type cover, it is possible to prevent influence of external temperatures on the temperature inside the screen printer 100 upon changing the stencil mask S, and thus, improve operation performance of the screen printer 100.

In addition, since the preset operation standby time for the stencil mask S is counted, and the stencil mask S can be semi-automatically introduced, the number of manual operations by the operator is reduced, thus reducing time to change the stencil mask S to a new stencil mask S.

While exemplary embodiments have been described with reference to the accompanying drawings, the exemplary embodiments are not intended to limit the inventive concept.

As can be seen from the foregoing, since the screen printer 100 has introduction and extraction portions 210' and 210" for a stencil mask S such that the stencil mask S can be easily changed with a new one, rather than manually opening a cover, if any, the troublesome operation of manually opening and closing the cover by the operator can be removed, and variation in temperature in the screen printer 100 due to external temperatures can be reduced to improve performance of the screen printer.

Although exemplary embodiments have been described, it will be understood by those skilled in the art that a variety of modifications and variations may be made without departing from the spirit or scope of the inventive concept defined in the appended claims, and their equivalents.

What is claimed is:

1. A screen printer comprising:
a main body comprising an operation region in which a stencil mask is installable, and at least one introduction and extraction portion through which the stencil mask is introduced into the operating region from outside of the main body and is extracted from the operation region to outside of the main body; and
a conveyance unit which conveys the stencil mask introduced into and installed at the operation region to the at least one introduction and extraction portion when the stencil mask is replaced by a new stencil mask introduced through the at least one introduction and extraction portion, and conveys the new stencil mask to the operation region,
wherein the main body is located closely to and completely surrounds along a circumference of the at least one introduction and extraction portion, the at least one introduction and extraction portion has introduction and extraction functions in both sides of the operation region through the conveyance unit, and a mask guide of the stencil mask is located within the main body to be spaced from the at least one introduction and extraction portion.

2. The screen printer according to claim 1, wherein the at least one introduction and extraction portion has a slot shape.

3. The screen printer according to claim 2, wherein the main body further comprises a blocking member which is configured to open or close the at least one introduction and extraction portion.

4. The screen printer according to claim 3, wherein the blocking member is attached to at least one part of the main body where the at least one introduction and extraction portion is formed, and is configured to open or close the at least one introduction and extraction portion by rotation.

5. The screen printer according to claim 4, wherein the blocking member is attached to the at least one part of the main body through a shaft which comprises an elastic member providing a torsional elastic force which returns the blocking member from a position at which the at least one introduction and extraction portion is open to a position at which the at least one introduction and extraction portion is closed.

6. The screen printer according to claim 3, wherein the at least one introduction and extraction portion and the blocking member are formed at a side surface of the main body.

7. The screen printer according to claim 6, wherein a dimension of the at least one introduction and extraction portion is substantially the same as a dimension of a side of the stencil mask facing the at least one introduction and extraction portion when the stencil mask is introduced into the operation region or extracted from the operation region.

8. The screen printer according to claim 3, wherein a dimension of the at least one introduction and extraction portion is substantially the same as a dimension of a side of the stencil mask facing the at least one introduction and extraction portion when the stencil mask is introduced into the operation region or extracted from the operation region.

9. The screen printer according to claim 1, wherein the main body further comprises a blocking member which is configured to open or close the at least one introduction and extraction portion.

10. The screen printer according to claim 9, wherein a dimension of the at least one introduction and extraction portion is substantially same as a dimension of a side of the stencil mask facing the at least one introduction and extraction portion when the stencil mask is introduced into the operation region or extracted from the operation region.

11. The screen printer according to claim 1, wherein the at least one introduction and extraction portion comprises an introduction side portion and an extraction side portion, and
wherein the introduction side portion is configured such that the stencil mask is extracted from the operation region to outside of the main body through the extraction side portion, and the introduction side portion is configured such that the new stencil mask is introduced into the operation region through the introduction side portion.

12. The screen printer according to claim 1, wherein the conveyance unit comprises:
the mask guide comprising at least one mask guide which slidably supports the stencil mask to introduce the stencil mask into the operation region and extract the stencil mask from the operation region to the outside of the main body along a conveyance path provided in the main body;
a slide part which reciprocates along the conveyance path; and
a conveyance part which is connected to the slide part and contacts a front or rear end of the stencil mask so that the stencil part moves along the conveyance path.

13. The screen printer according to claim 12, wherein at least one seating groove having an "L" shape configured to support the stencil mask is formed in an upper surface of the at least one mask guide.

14. The screen printer according to claim 12, wherein the conveyance part comprises a rod which contacts the front or rear end of the stencil mask, and
wherein the rod comprises a packing formed at an end thereof to attenuate an impact when the rod contacts the front or rear end of the stencil mask.

15. The screen printer according to claim 1, further comprising a detection sensor which is disposed in the operation region adjacent to the at least one introduction and extraction portion, and detects introduction of the stencil mask into the main body through the at least one introduction and extraction portion, and generates a detection signal when the introduction is detected.

16. The screen printer according to claim 15, wherein the detection sensor comprises a plurality of sensors which are installed at a position of the operation region and respective positions where the stencil mask is introduced into the main body and extracted from the operation region, and generate the detection signal of the stencil mask at the position and the respective positions, respectively.

17. The screen printer according to claim 1, wherein the conveyance unit controls the stencil mask to be extracted from the operation region after a preset operation standby time from a time when the stencil mask is introduced into the operation region.

* * * * *